US012713518B2

(12) United States Patent
Harrigan et al.

(10) Patent No.: US 12,713,518 B2
(45) Date of Patent: Aug. 18, 2026

(54) STRUCTURALLY ENHANCED FILTERING OF CIRCUIT BOARD PLANES

(71) Applicant: Microsoft Technology Licensing, LLC, Redmond, WA (US)

(72) Inventors: Jason Harrigan, Sultan, WA (US); Fatemeh Zolfaghar, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 504 days.

(21) Appl. No.: 18/335,580

(22) Filed: Jun. 15, 2023

(65) Prior Publication Data

US 2024/0422895 A1 Dec. 19, 2024

(51) Int. Cl.
*H05K 1/02* (2006.01)

(52) U.S. Cl.
CPC ......... *H05K 1/0225* (2013.01); *H05K 1/0222* (2013.01); *H05K 1/0231* (2013.01); *H05K 1/0233* (2013.01); *H05K 1/0298* (2013.01); *H05K 2201/093* (2013.01); *H05K 2201/09618* (2013.01); *H05K 2201/0969* (2013.01); *H05K 2201/09972* (2013.01); *H05K 2201/1006* (2013.01)

(58) Field of Classification Search
CPC .. H05K 1/0231; H05K 1/0222; H05K 1/0233; H05K 1/0298; H05K 2201/093; H05K 1/0265; H05K 2201/09618; H05K 2201/0979; H05K 2201/10636; H05K 1/0225; H05K 2201/09309; H05K 2201/0969; H05K 2201/09727; H05K 2201/09972; H05K 2201/1006; H05K 1/0218; H05K 2201/0715; H05K 2201/09345; H05K 2201/10689
See application file for complete search history.

(56) References Cited

U.S. PATENT DOCUMENTS 6,614,325 B1 * 9/2003 Kocin ................. H05K 1/0245 174/251
9,966,345 B1 5/2018 Sizikov
(Continued)

OTHER PUBLICATIONS

Invitation to Pay Additional Fees received for PCT Application No. PCT/US2024/031362, Oct. 1, 2024, 12 pages.
(Continued)

*Primary Examiner* — Steven T Sawyer

(57) ABSTRACT

Techniques and assemblies for enhanced circuit board layouts and circuit configurations are presented. In one example, an apparatus includes a circuit board having a power plane configured to carry electrical current from a power supply circuit to load circuitry. The power plane comprises a fence region that establishes an increased characteristic impedance of the power plane and has vias arrayed across the power plane which perforate the power plane and electrically couple to a ground plane of the circuit board. A filter is established at the fence region by at least capacitance elements electrically coupled between the power plane and the ground plane, the filter configured to route at least a portion of noise carried by the power plane to the ground plane at the fence region.

19 Claims, 7 Drawing Sheets

(56) References Cited

U.S. PATENT DOCUMENTS

| | | | | |
|---|---|---|---|---|
| 2001/0004942 | A1* | 6/2001 | Rehm | H05K 1/0231 174/262 |
| 2002/0027773 | A1* | 3/2002 | Davidson | H05K 1/0231 361/768 |
| 2004/0201971 | A1* | 10/2004 | Fessler | H05K 1/0218 174/262 |
| 2005/0224912 | A1 | 10/2005 | Rogers | |
| 2013/0003333 | A1* | 1/2013 | Toyao | H05K 1/0298 361/777 |
| 2018/0351595 | A1* | 12/2018 | Tarui | H04B 1/38 |

OTHER PUBLICATIONS

International Search Report and Written Opinion received for PCT Application No. PCT/US2024/031362, Nov. 26, 2024, 15 pages.

International Preliminary Report on Patentability (Chapter I) received for PCT Application No. PCT/US2024/031362, mailed on Dec. 26, 2025, 10 pages.

* cited by examiner

STRUCTURALLY ENHANCED FILTERING OF CIRCUIT BOARD PLANES

BACKGROUND

Power planes and ground planes can be used in multi-layer circuit boards to form high current capacity links between power supply circuitry and load circuits or systems. These planes typically comprise wide areas of conductive material having very low characteristic impedances. High operating frequency circuitry, such as memory devices, central processing units (CPUs), graphics processing units (GPUs), or systems-on-a-chip (SoCs) can create unwanted electrical noise that is coupled onto corresponding power planes which supply power to such devices and circuitry. Moreover, these devices typically have high current draws along with the high frequency/high bandwidth noise, making filtering noise on power links challenging. Once coupled onto the power plane, this noise can then propagate throughout an entire computing system, which might cause interference, failures, or data loss with regard to other components, as well as lead to lack of compliance with various radiative or conducted emission standards for electrical systems, referred to as electromagnetic interference (EMI).

The lower characteristic impedance of power planes differs from the relatively higher characteristic impedances of signal traces formed from relatively thin striplines or microstrips. While capacitors are often employed to filter noise carried by signal traces, the low characteristic impedance of planar structures on circuit boards face difficulties with this type of filtering. This is due in part to the power planes having lower impedances as compared to capacitors used for noise filtering in high frequency scenarios.

SUMMARY

Techniques and systems for enhanced circuit board layouts and circuit configurations are discussed herein. Specifically, techniques and circuit board configurations are included which mitigate noise and electromagnetic interference (EMI) for power planes. The examples herein present structurally enhanced filtering of circuit board planes which incorporate a fence region formed using structural features of power/ground planes on a circuit board along with filtering capacitors arrayed across the fence region. Various enhanced layouts and configurations can have neckdowns included in power plane layout/routing which further establish increased characteristic impedance portions of a power plane, which can be spanned with an array of capacitance filtering elements. This increased characteristic impedance portion of the power plane can reject certain noise components generated from high operating frequency integrated circuitry by providing an enhanced location for filter capacitors to further shunt noise to a ground plane.

In one example, an apparatus includes a circuit board having a power plane configured to carry electrical current from a power supply circuit to load circuitry. The power plane comprises a fence region that establishes an increased characteristic impedance of the power plane and has vias arrayed across the power plane which perforate the power plane and electrically couple to a ground plane of the circuit board. A filter is established at the fence region by at least capacitance elements electrically coupled between the power plane and the ground plane, the filter configured to route at least a portion of noise carried by the power plane to the ground plane at the fence region.

In another example, a method of manufacturing includes forming a circuit board having a power plane that establishes a pathway for electrical current from power supply circuitry to load circuitry, and forming the power plane as having a fence region that establishes an increased characteristic impedance of the power plane and having vias arrayed across the power plane which perforate the power plane and electrically couple to a ground plane of the circuit board. The method also includes forming footprints for surface mount capacitors arrayed across the fence region, and forming vias in the circuit board coupling first terminals of the capacitors to the power plane.

In yet another example, an assembly includes a circuit board comprising a ground plane formed on a first surface of the circuit board, and a power plane formed on an internal layer of the circuit board and configured to provide a pathway for electrical current from power supply circuitry to load circuitry. The power plane comprises a fence region that establishes an increased characteristic impedance of the power plane and having vias arrayed across the power plane which perforate the power plane and electrically couple to a ground plane of the circuit board. The circuit board also includes footprints for surface mount capacitors arrayed across the fence region, with first terminals of the footprints coupled through vias to the power plane and second terminals of the footprints coupled to the ground plane.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Power planes and ground planes can be used in multi-layer circuit boards to form high current capacity links between power supply circuitry and load circuits or systems. These planes typically comprise wide areas of conductive material having very low characteristic impedances. Various high operating frequency circuitry, such as memory devices, central processing units (CPUs), graphics processing units (GPUs), or systems-on-a-chip (SoCs) can create unwanted electrical noise that is coupled onto corresponding power planes. Capacitors are often employed to filter noise carried by signal links (e.g., data or control lines), but the low characteristic impedance of planar structures on circuit boards face difficulties with this type of filtering.

The examples herein present structurally enhanced filtering of circuit board planes which incorporate a fence region formed using structural features of power planes on a circuit board along with filter capacitors arrayed across the fence region. Optionally, the structural features can include a narrowed or necked down region of a power plane that can enhance the effectiveness of the fence region. The fence regions can be used to establish increased characteristic impedance portions of a power plane to reject certain noise components generated from high operating frequency integrated circuit devices and provide enhanced arrangements for filter capacitors to further shunt noise to a ground plane. These configurations advantageously can mitigate noise and electromagnetic interference (EMI) associated with power planes. Also, the examples herein can enable higher density printed circuit boards (PCBs) with potentially fewer layers by providing a more effective way to filter noise. Reduced costs of design and manufacturing, higher performance, and reduced time-to-market for high speed and high density computing systems can be achieved.

Figure 1:
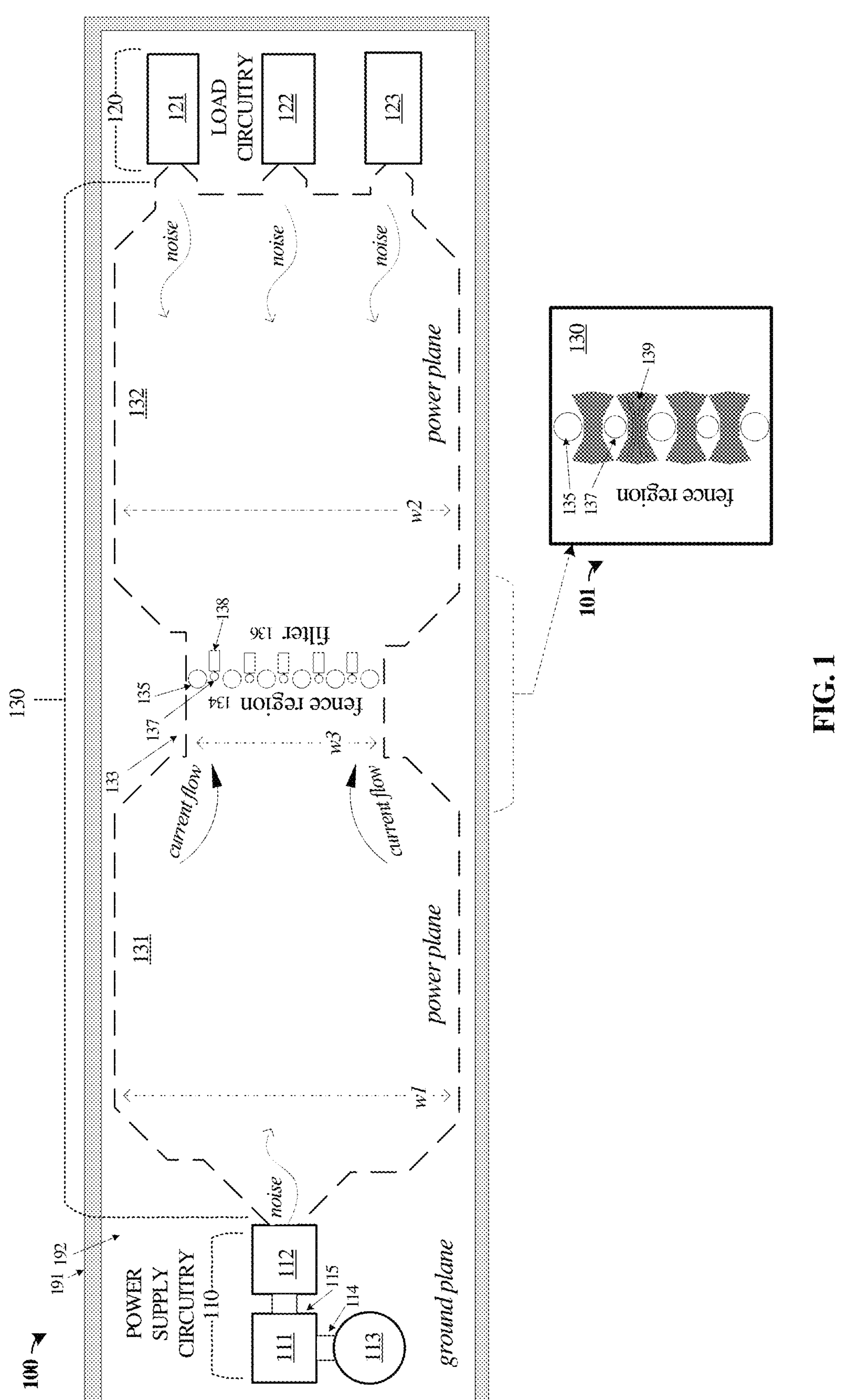
FIG. 1 illustrates an example circuit board layout in an implementation.

Turning to a first example implementation, FIG. 1 is presented. FIG. 1 illustrates an example circuit board layout in an implementation. Configuration 100 presented in FIG. 1 includes circuit board 191 which is formed from various stacked layers including ground plane 192 and power plane 130. Although not required, power plane 130 can be an internal layer of circuit board 191, with ground plane 192 (among other ground planes) positioned above or below power plane 130 in the layered stackup of circuit board 191. Alternatively, a power plane might be an external layer of circuit board 191, with one or more ground planes being positioned as internal layers or as a further external layer, including combinations thereof. Circuit board 191 can form an assembly having power supply circuitry 110 coupled to load circuitry 120 over ground plane 192 and power plane 130. Ground plane 192 can include an area which spans over any of the circuitry and planes included in circuit board 191, although various are typically determined according to the actual implementation.

Power plane 130 includes first region 131, second region 132, and third region 133. Third region 133 comprises a narrower width (w3) region than first region 131 (w1) and second region 132 (w2), and can be referred to as a neckdown. Thus, the width (w3) of third region 133 establishes a channel through which the current carried by power plane 130 flows. Although the neckdown is positioned between two wider portions of power plane 130, other examples might only have one wider portion of power plane 130, or other configurations. Also, the neckdown of power plane 130 might be omitted, and the structural arrangement of vias 135/137 can be formed at other selected locations on power plane 130.

Load devices 121-123 typically produce noise or EMI at a similar frequency as the clock frequencies which drive internal circuit elements of load devices 121-123, among harmonics thereof. This noise can propagate onto power plane 130, which can lead to unwanted effects, as mentioned above. Moreover, noise from power supply circuitry can also propagate onto power plane 130. Example noise propagation representations are included in FIG. 1 for illustrative purposes.

Third region 133 comprises fence region 134 which features an arrangement of vias 135/137 which can mitigate effects of the aforementioned noise and EMI. While a neckdown is included at third region 133 in this example, this neckdown is not required, but when included can enhance the effectiveness of fence region 134. Various features are included in power plane 130 at fence region 134, such as ground plane vias 135, and power plane vias 137. These vias restrict the total amount of conductive material of power plane 130 at fence region 134, by establishing cutouts or perforations in power plane 130. As shown in FIG. 1, power plane vias 137 are arranged between corresponding ground plane vias. This arrangement is included to show one example configuration of power plane vias, and it should be understood that this arrangement can vary. Thus, a high-density current is established in the neckdown of power plane 130, with a higher characteristic impedance as compared to first region 131 and second region 132. The higher characteristic impedance is established by the optional neckdown of power plane 130, and also by the co-located arrangement of vias 135/137 across power plane 130.

Capacitors or other capacitance elements can be arrayed on a surface of circuit board 191 across fence region 134, forming filter 136. Example capacitance elements (capacitors) 138 are shown. First terminals of the capacitance elements can couple to power plane vias 137, which couple to power plane 130 (which may be an internal layer), and second terminals of the capacitance elements can couple to ground plane 192. When ground plane 192 comprises an external layer of circuit board 191, the capacitance elements can couple on an external layer of circuit board 191 to ground plane 192. Ground plane vias 135 can couple between ground plane 192 and one or more additional ground plane layers (not shown), such as a ground plane layer on another internal layer or another external layer of circuit board 191.

In operation, high frequency noise produced by load circuitry 120 experiences an increased characteristic impedance at fence region 134, and this noise is then filtered by being shunted or routed to ground plane 192 by filter 136. Moreover, noise produced by power supply circuitry 110 can experience a similar characteristic impedance increase and be filtered to ground plane 192. Capacitors 138 are arrayed in parallel, reducing the net impedance (equivalent series resistance, ESR) for any individual capacitor, and fence region 134 has a via configuration selected to have a greater characteristic impedance for the noise (i.e., at corresponding noise frequencies) than power plane 130. Thus, filter 136 routes components of the noise to ground or a reference potential, establishing an impedance barrier at fence region 134 by the combination of capacitors 138 and inductance from the neckdown structural arrangement of power plane 130 and vias 135/137. This has the effect of blocking at least a portion of the noise from propagating to other regions of power plane 130, such as region 131, and the noise is advantageously contained within region 132.

View 101 shows additional details of fence region 134. View 101 illustrates a portion of power plane 130 proximate to fence region 134. Various current channels 139 are formed between vias 135 and 137, which can increase the characteristic impedance of power plane 130 at such channels. This increase in characteristic impedance can form an impedance barrier for noise at fence region 134, and when combined with filter 136, can route noise to ground more effectively than examples that lack a fence region. Moreover, when fence region 134 is combined with a neckdown of power plane 130 at third region 133, then further current channeling can be established, with further increases in characteristic impedance of power plane 130 at fence region 134.

Returning to the elements of FIG. 1, power supply circuitry 110 includes voltage regulator circuit 111 which is complemented by capacitor arrangement 113 and inductor arrangement 112 coupled over links 114-115, respectively. Power supply circuitry 110 typically converts an input voltage to an output voltage suitable for power plane 130, and is sized according to the current needs to load circuitry 120. Capacitor arrangement 113 and inductor arrangement 112 can form a part of a switching regulator, such as a step down (e.g., buck) or step up (e.g., boost) type or regulator, among other topologies. Thus, capacitor arrangement 113 and inductor arrangement 112 can filter switching noise of switching elements of power supply circuitry 110, as well as provide energy storage capability in certain topologies. Voltage regulator circuit 111 can include various controller elements, regulator circuitry, power transistor elements, as well as various passive and active components.

Load circuitry 120 includes load devices 121-123 which comprise various integrated circuit devices which operate at a selected operating frequency driven by one or more clock signals (not shown). Examples of load devices 121-123 include memory devices (e.g., DRAM or SRAM), central processing units (CPUs), graphics processing units (GPUs), or systems-on-a-chip (SoCs), field programmable gate arrays (FPGAs), application specific integrated circuits (ASICs), data cache devices, or other devices.

Capacitance elements 138 might comprise various capacitor types and technologies, such as surface mount capacitors, multilayered ceramic chip capacitors (MLCC), semiconductor capacitors, as well as electrolytic or ceramic capacitors. Capacitor arrangement 113 might include similar capacitor types discussed for capacitance elements 138. Inductor arrangement 112 can comprise various types of inductors, surface mount, through-hole, discrete coil inductors, semiconductor inductors, transformer coil-based inductors (e.g., in trans-inductor voltage regulator topologies), among others.

Circuit board 191 comprises a multi-layer or stacked arrangement having laminated conductive and insulating layers, along with various solder masking and silk screen labeling, among other elements. Within circuit board 191, various signal routes/traces are included, as well as component footprints and via structures. Among these elements are power plane 130 and ground plane 191, which may include further power planes and ground planes.

Figure 2:
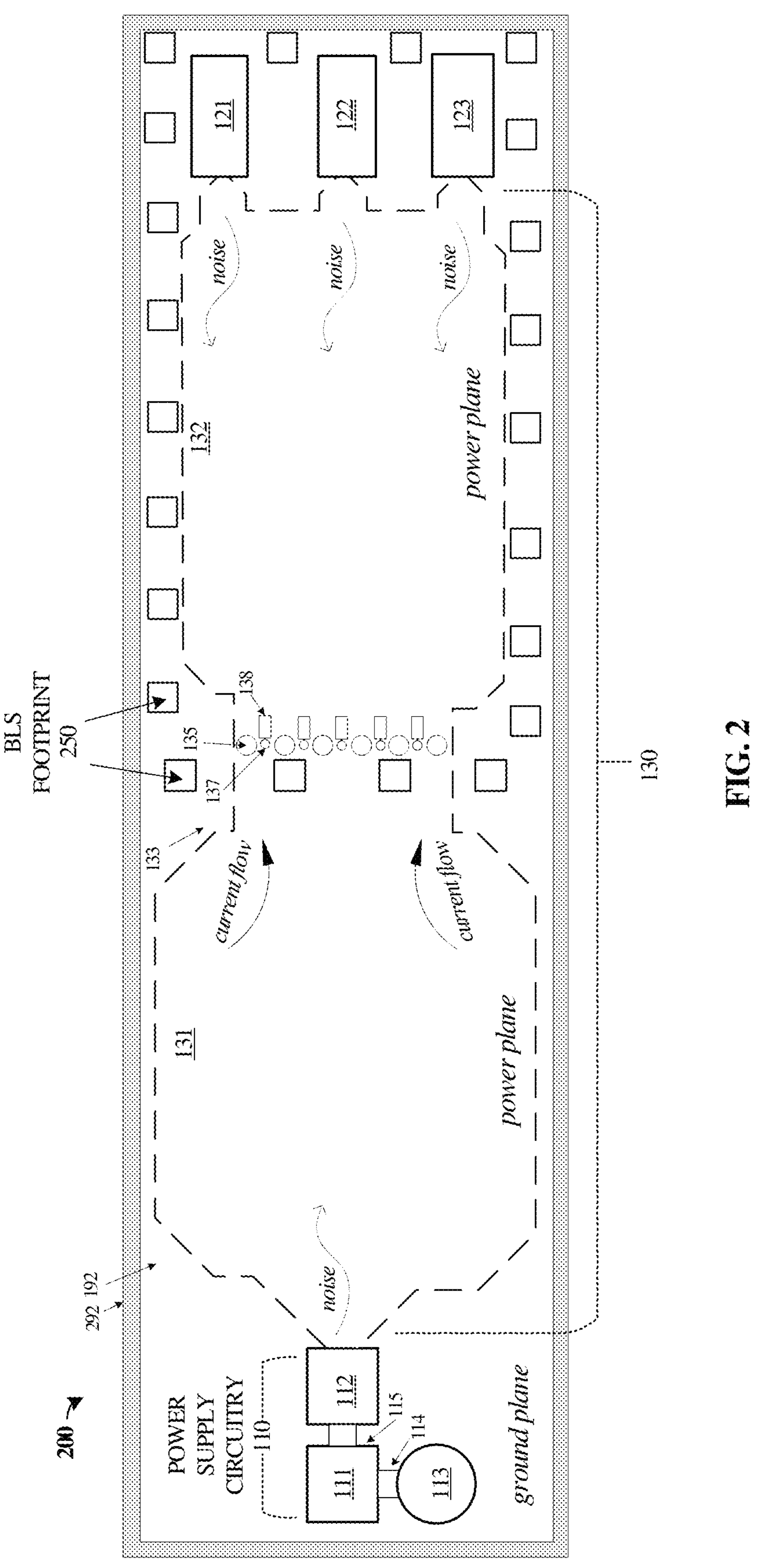
FIG. 2 illustrates an example circuit board layout that provisions for a board-level shield in an implementation.

Turning to another example implementation, FIG. 2 is presented. Configuration 200 presented in FIG. 2 includes circuit board 292 which is formed from various stacked layers including ground plane 192 and power plane 130. FIG. 2 illustrates an example circuit board layout in an implementation similar to that shown for FIG. 1, but an optional board-level shield (BLS) or BLS fence is included. While similar elements are included in FIG. 2 as found in FIG. 1, it should be understood that variations are possible.

A BLS comprises a lid or cover which is attached to a circuit board at regular intervals using pads or through-hole connections, and these pads or through-hole connections are many times associated with ground stitching vias (not shown). A BLS can be included on a circuit board to provide shielding or attenuation of radiated emissions generated by circuitry on the circuit board, as well as to reduce susceptibility of circuitry to external interference. However, the pads and/or ground stitching vias used to attach a BLS can create difficulties for placement and routing of various components and ground/power/signal elements. FIG. 2 shows one example implementation of structurally enhanced filtering of circuit board planes with BLS features, namely BLS footprints 250 which couple to a conductive shield or cap/cover (not shown).

BLS footprints 250 comprise conductive pads formed onto a surface of circuit board 292 which forms a fence or perimeter about circuitry, namely load circuitry 121-123, and a cap or shield is applied onto the footprints. However, in this example BLS footprints 250 are extended to encompass second region 132 and third region 133 (e.g., fence region 134 at the neckdown). BLS footprints 250 thus form an additional noise 'fence' across the neckdown, which further increases the impedance of power plane 130, increasing the effectiveness of filter 136 and capacitors 138. Configuration 200 thus shows a circuit board which is integrated with board-level shields in such a way that the filtering performance and shielding performance are both improved without additional tradeoffs. In addition, configuration 200 can include other arrangements to establish increased characteristic impedances, such as sharing the same ground vias between capacitors 138 and BLS footprints 250 to improve DC current performance. Advantageously, BLS footprints included on a circuit board are configured to couple to a board-level shield component that shields against at least a portion of radiated emissions or radiated EMI generated by the load circuitry. BLS footprints 250 provides a return path for noise currents, keeping the noise current loop low, as well as establishing an enhanced arrangement making it more difficult for noise to bypass or "jump over" the impedance barrier and re-couple onto power plane 130. Fence region 134 and filter 136, positioned proximate to the board-level shield footprints, is configured to shield against at least a portion of conducted emissions or conducted EMI generated by the load circuitry. The inclusion of both the impedance barrier and the BLS footprints can enhance the performance of both arrangements.

Figure 3:
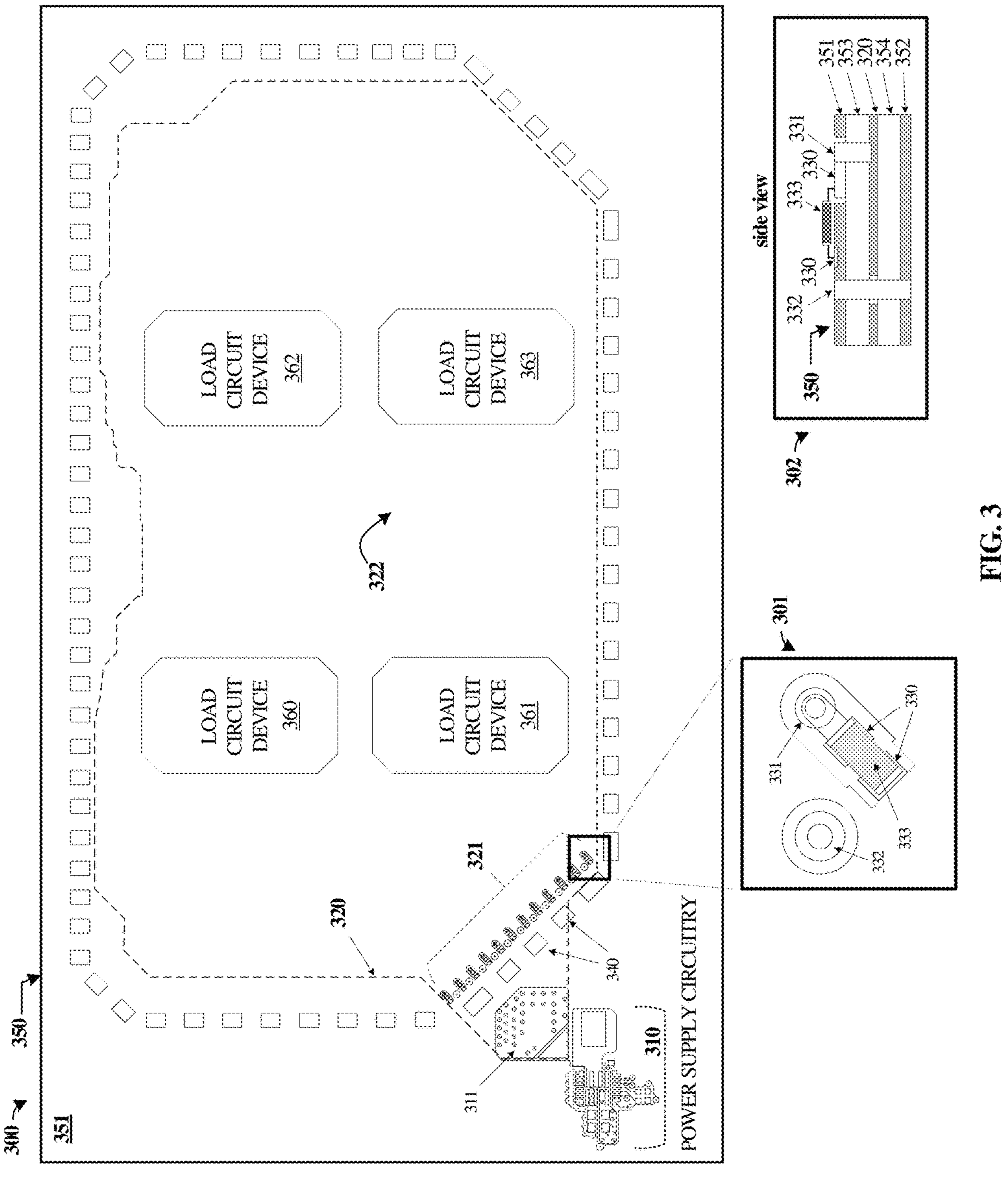
FIG. 3 illustrates an example circuit board layout that provisions for a board-level shield in an implementation.
Figure 4:
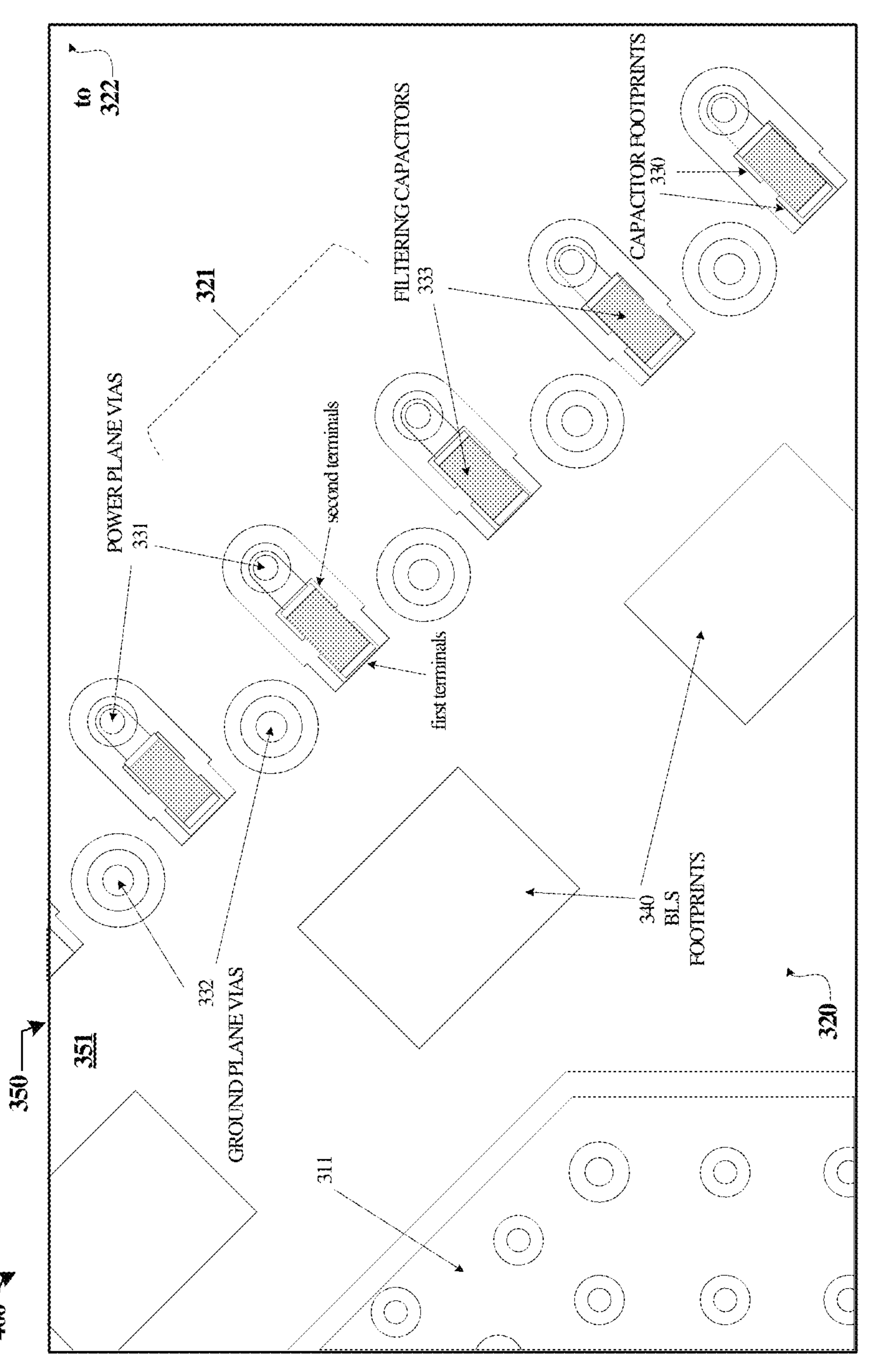
FIG. 4 illustrates an example circuit board layout with a detailed view of an impedance barrier in an implementation.
Figure 5:
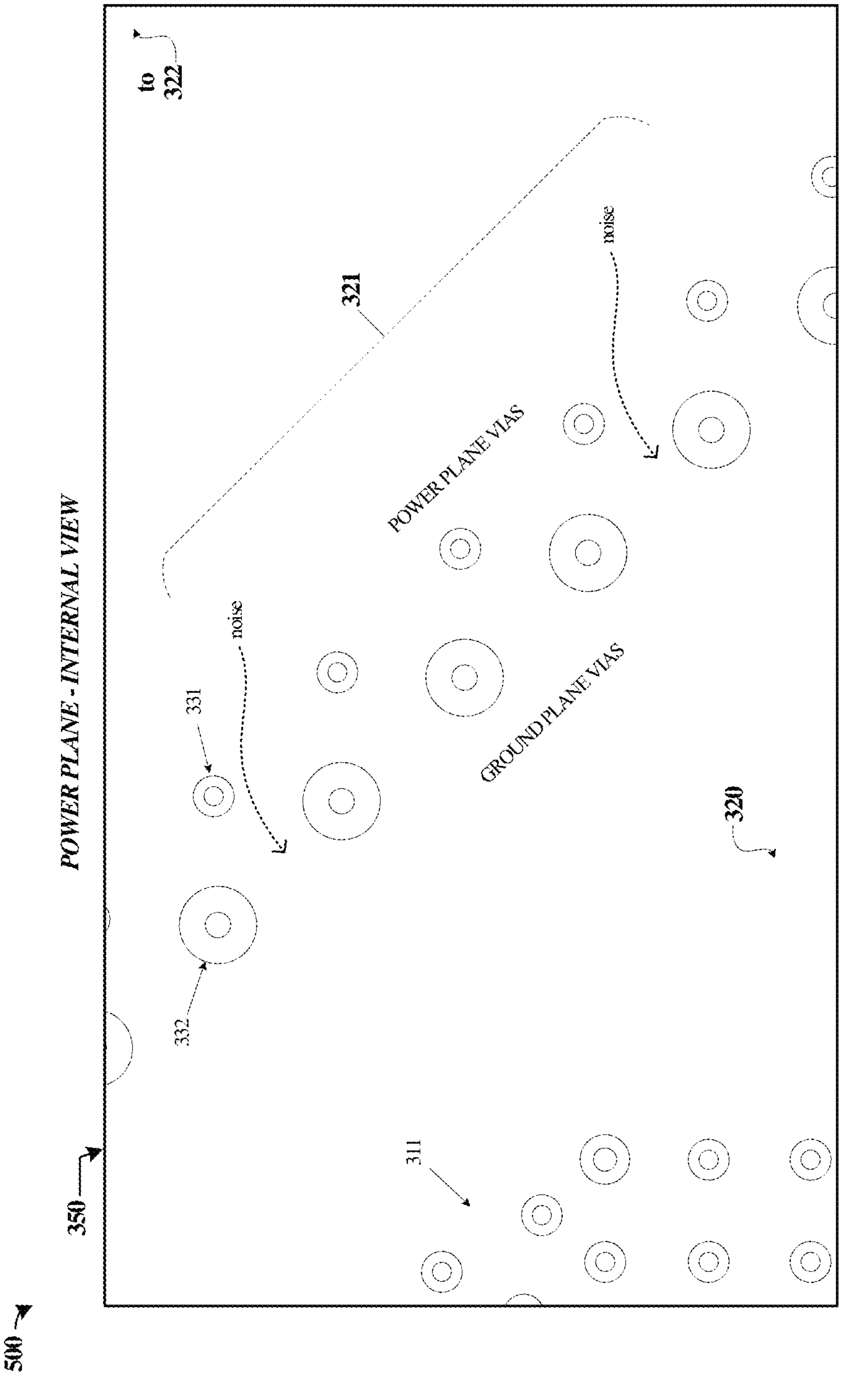
FIG. 5 illustrates an example power plane configuration in an implementation.

Turning to further examples of structurally enhanced power plane filtering, FIGS. 3-6 are presented. FIGS. 3-6 include various views highlighting circuit board 350 having an impedance barrier and BLS. FIG. 3 illustrates an example circuit board layout for circuit board 350 that provisions for a board-level shield in an implementation. FIG. 4 illustrates an example circuit board layout with a detailed view of the impedance barrier of circuit board 350 in an implementation. FIG. 5 illustrates an example power plane configuration of circuit board 350 in an implementation.

Turning first to FIG. 3, view 300 illustrates a portion of circuit board 350 in an overhead partial schematic view. View 300 represents a circuit board layout showing component footprints, conductive planes, and representative signal routing. Thus, view 300 is a simplified view of circuit board 350, omitting some elements to focus on the relevant concepts. View 301 includes a detailed view of elements included in fence region 321 of power plane 320. View 302 includes a side cross-sectional view of one example layered stackup of circuit board 350 as well as one example instance of a capacitor/via arrangement, although variations are possible.

In view 300, circuit board 350 includes power supply circuitry 310 which supplies power at a selected voltage to load circuit devices 360-363, which comprise high-speed integrated circuit devices in this example. Power plane 320 includes wide region 322 that couples to load circuit device 360-363 and an optional neckdown at fence region 321 which comprises a region narrower than wide region 322. Input region 311 is also shown which includes a plurality of vias coupling power plane 320 to an output node of power supply circuitry 310. BLS footprints 340 are included on circuit board 350 which form a fence or perimeter around power plane 320 that includes both wide region 322 and fence region 321. BLS footprints 340 span across the neckdown between input region 311 and the impedance barrier formed at fence region 321.

In view 302, power plane 320 is shown as an internal layer to circuit board 350, and ground plane 351 comprise a surface or external layer of circuit board 350. Thus, power plane 320 is 'below' ground plane 351 from the vantage of view 300. Additional power plane 352 can form another surface or external layer of circuit board 350, but is hidden in view 300. View 302 also shows example capacitor 333 mounted to capacitor footprints 330 to respective electrical nodes. Namely, a first terminal of capacitor 333 couples to power plane via 331, and via 331 couples to power plane 320 through layer 353. Via 331 might penetrate the entire stackup of circuit board 350, or may instead penetrate only a subset of the layers (as shown). A second terminal of capacitor 333 couples to ground plane 351 directly. Ground plane via 332 is shown as coupling ground planes 351-352 through the entire stackup of circuit board 350. Layers 353-354 comprise insulating layers, such as formed from epoxy resin and glass fabric composite, ceramic, glass, or other materials which act as core or prepreg materials with respect to layers 320, 351, and 352. Layers 351-352 and 320 comprise conductive materials, such as copper or aluminum foil material coupled onto or between layers 353-354.

The impedance barrier formed at fence region 321 includes features which are detailed in view 301, and such features are repeated a selected number of times across fence region 321. Specifically, fence region 321 includes capacitor footprints 330, power plane vias 331, and ground plane vias 332, along with BLS footprints 340 and the physical arrangement of fence region 321. Thus, capacitor footprints 330, power plane vias 331, and ground plane vias 332 span in an arrayed manner across the width of fence region 321. Capacitors 333 form a filter arrangement with fence region 321. Capacitors 333 can be populated onto capacitor footprints 330 during circuit board assembly and manufacturing processes, such as during a solder reflow process or similar operation.

FIG. 4 illustrates an example circuit board layout with a detailed view of fence region 321 of circuit board 350 in an implementation. View 400 illustrates a portion of circuit board 350 in an overhead partial schematic view. View 400 represents a circuit board layout showing component footprints, conductive planes, and representative signal routing. Thus, view 400 is a simplified view of circuit board 350, omitting some elements to focus on the relevant concepts. View 400 shows a portion of the array of capacitors 333 filtering noise before the noise can leave wide region 322 of power plane 320.

Within view 400, a portion of input region 311 is included which shows associated vias which couple plane 320 to an output node of power supply circuitry 310 (not shown). BLS footprints 340 are included on circuit board 350 which form a fence or perimeter around power plane 320 that includes both wide region 322 and fence region 321, although wide region 322 is not visible in view 400. BLS footprints 340 span across fence region 321 between input region 311 and the impedance barrier and filter formed at fence region 321.

View 400 includes a close-up view of the via structures and capacitor placements at fence region 321. Specifically, ground vias 332 are alternated with capacitor footprints 330 which couple between ground plane 320 and power plane vias 331. While capacitors 333 are shown as surface mount capacitors in this Figure, any suitable capacitance elements can instead be included. Thus, an array of capacitance elements is electrically coupled between power plane 320 and ground plane 351 at fence region 321. First terminals of the array of capacitors couple to power plane 320 over corresponding vias 331 that penetrate through at least ground plane 351 to reach power plane 320. Second terminals of the array of the capacitors couple to ground plane 320.

Figure 7:
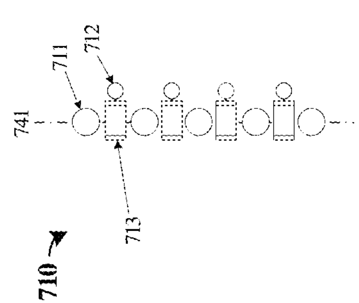
FIG. 7 illustrates various configurations and arrangements of vias and capacitors at fence regions.
Figure 7:
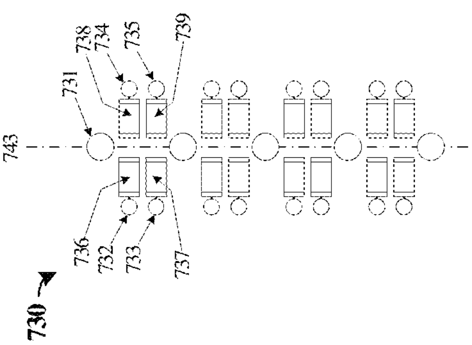
Figure 7:
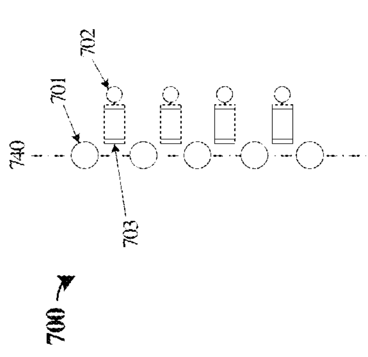
Figure 7:
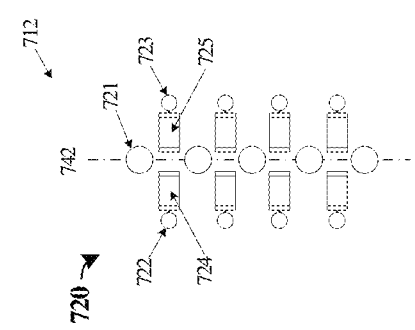

The capacitance elements, such as capacitors 333, can have a selected quantity of different capacitance values interspersed among the array of capacitance elements. For example, each of the different capacitance values can be selected to route a selected frequency portion of the noise to ground plane 350 from power plane 320. In one example, three capacitance values might be included, with a first capacitance value selected to provide a low impedance to a first frequency range, a second capacitance value selected to provide a low impedance to a second frequency range, and a third capacitance value selected to provide a low impedance to a third frequency range. The term low impedance can refer to an impedance lower than the characteristic impedance of power plane 320 at fence region 321. Thus, for each frequency range/component of the noise, a corresponding portion can see a low impedance pathway to ground through a corresponding set of capacitors. To provide such an arrangement, more than one capacitor can be included at each via structure, with capacitor footprints pinwheeled or radially arranged about individual power plane vias, radially arranged about individual ground plane vias, or with other arrangements (such as seen in FIG. 7) to place more than one capacitor between a set of ground plane vias. Moreover, the quantity and spacing among capacitors of similar frequency range can vary based on the frequency range itself. For a first, lower frequency range, capacitors can be spaced farther apart (and a lesser quantity employed), than a second, higher frequency range. Capacitors can be arranged on both sides of a circuit board to couple to associated planes/vias, with a pattern of different capacitance values selected to be in a staggered arrangement with respect to both sides.

FIG. 5 illustrates an example circuit board layout with a detailed view of fence region 321 of circuit board 350 in an implementation. View 500 illustrates a portion of circuit board 350 in an internal partial schematic view to focus on an exposed section of power plane 320. View 500 represents a circuit board layout showing vias within conductive plane 320. Thus, view 500 is a simplified portion of circuit board 350, omitting some elements to focus on the relevant concepts. View 500 shows a portion of the array of via structures for power plane vias and ground plane vias at fence region 321, as well as some contextual vias for input region 311.

As can be seen for ground plane vias 332, these vias penetrate through power plane 320 to couple between ground plane 351 and ground plane 352. From the perspective of power plane 320 and noise carried thereon, ground plane vias 332 form a 'fence' or partial barrier across power plane 320, increasing a characteristic impedance for noise carried by power plane 320 at fence region 321. This increase in characteristic impedance is in addition to the increase in characteristic impedance of power plane 320 by the optional selected geometry of the neckdown of power plane 320 and placement of fence region 321 at the neckdown, which establishes a reduced planar width as compared to region 322. Power plane vias 331 terminate at power plane 320, and thus are electrically coupled at the internal layer of circuit board 350 shown in this view.

Advantageously, the examples herein provide fence regions that establish impedance barriers to inhibit or block unwanted conduction of RF or high-frequency noise generated by devices. The noise can be shunted or routed to ground planes with a filter using an array of capacitors arranged across a fence region of a power plane. This fence region is restricted in conductive area by the use of regularly spaced vias spread across the fence region, as well as BLS attachment pads or footprints (if employed) and a planar neckdown (if employed). Thus, the impedance barrier is established at least in part "structurally" at the fence region, which ensures an increased characteristic impedance for the power plane. The characteristic impedance is increased at the fence region by the spacing of the capacitors and ground via cut out size, creating a ratio of capacitors and amount of plane copper that each capacitor is filtering. The impedance barrier can be further enhanced by selected or staggered capacitance values of the array of capacitors arrayed across the fence region and electrically coupled between a ground plane and the power plane. Additionally, if the fence region is located at a neckdown formed in a power plane, a more efficient use of filtering capacitors can be established, such that the quantity of capacitors is less.

However, issues can arise with use of too many vias or capacitors which may reduce the width of the power plane too much to reduce DC current performance. Therefore, the examples herein can optimize or otherwise provide selected ground via usage to keep the power plane as intact as possible for DC current capacity while achieving target noise reduction performance. Thus, the layouts selected for power planes and ground planes can balance several factors, namely the integrity power plane current carrying capacity balanced against the quantity of capacitors and vias used to establish the impedance barrier. Areas where the power plane is restricted due to ground vias (and hence higher impedance) are precisely the areas where the capacitors are shunting the noise. In this way, the overall performance of the noise 'filter' is increased. From an electromagnetic propagation point of view, small inductors are created in the power plane and used by the filter. This has the effect of containing noise components within a region of the power plane localized to the load circuit which generates the noise.

When multiple power planes are employed in a circuit board, these power planes might at least partially overlap in the stackup of the circuit board. Separate impedance barriers can be included for each power plane, with fence regions configured to not overlap, or not overlap on the same surface/exterior layer. For example, a first power plane coupling a first voltage regulator providing a first voltage level can couple to an integrated circuit device, and a second power plane coupling a second voltage regulator providing a second voltage level can couple to the same integrated circuit. Separate fence regions can be established for each of the first and the second power planes such that fence regions are non-overlapping and capacitor arrays/via structures for each power plane are arranged across corresponding fence regions. If overlapping fence regions are needed due to layout constraints, packaging requirements, or other concerns, then a first external surface of the circuit board can house a first fence region having a first set of filtering capacitors, and a second external surface of the circuit board can house a second fence region having a second set of capacitors. In such cases, the power planes are typically included on different vertical layers within the circuit board stackup.

Figure 6:
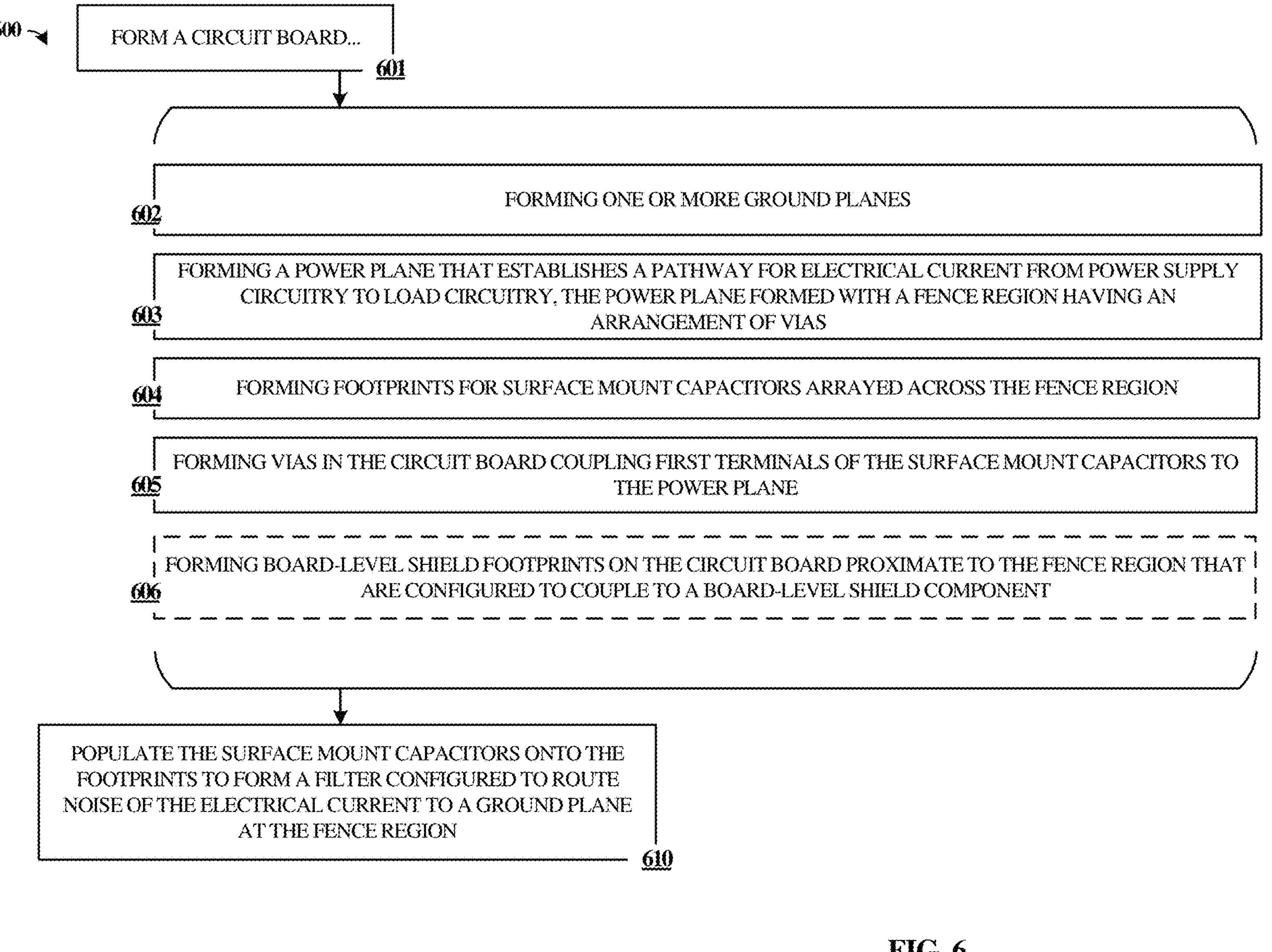
FIG. 6 illustrates an example method of manufacturing a circuit board assembly in an implementation.

Turning now to an example set of operations which can be used to manufacture a circuit board having an impedance barrier for noise, FIG. 6 is presented. FIG. 6 includes operations 600 which present an example method of manufacturing and assembly of a circuit board. Two main operations are included among operations 600-operation 601 which includes forming a circuit board, and operation 610 which includes assembly of a circuit board assembly having a circuit board and various components mounted thereto.

In operation 601, a circuit board is formed, such as circuit board 191 of FIG. 1, circuit board 201 of FIG. 2, or circuit board 350 of FIGS. 3-5. This circuit board can be manufactured using various standard techniques which establish a layered vertical stackup of conductive and insulating layers, each having various features including planes, traces, vias, and through-holes. Exterior layers of the circuit board can include further planes, signal routing, surface-mount footprints, solder masking, silkscreen labeling, protective or conformal coatings, or other elements. As discussed, the conductive layers can be formed from conductive foil material deposited onto core or prepreg material, although other techniques can be employed. View 302 illustrates one example vertical stackup which can be manufactured as such.

However, several enhanced features are included in the circuit boards discussed herein, and operations 602-606 describe manufacturing operations for these features. In one example, ground planes are formed (operation 602), which can include ground planes forming at least a portion of external surfaces of a vertical stackup comprising the circuit board. Internal ground planes can also be included, and the particular ground plane configuration can vary based on application. Example ground planes include ground plane 192 of FIGS. 1-2, and ground plane 351 of FIGS. 3-5.

In addition to one or more ground planes, one or more power distribution planes, or power planes, can be included in the vertical stackup in operation 603. A power plane can establish a pathway for electrical current from footprints/pads for power supply circuitry to footprints/pads for load circuitry. A fence region is formed in the power plane by arranging vias across the power plane. These vias can couple to one or more ground planes, thus perforating the power plane at the fence region. In some examples, a power plane can be optionally formed with a neckdown with a reduced width between additional regions of the power plane, and this neckdown can further increase a characteristic impedance which provides a location at which to place a fence region and associated structures. Example power planes include power plane 103 of FIGS. 1-2, and power plane 320 of FIGS. 3-5.

Within the fence region, footprints for surface mount capacitors are formed as arrayed across the fence region (operation 604). See example footprints 330 of FIGS. 3-5. Also, vias in the circuit board are formed coupling first terminals of the surface mount capacitors to the power plane (operation 605). See example vias 137-137 in FIGS. 1-2, and vias 331 in FIGS. 3-5. Optionally, board-level shield footprints can be formed on the circuit board proximate to the fence region that are configured to couple to a board-level shield component (operation 606). See example BLS footprints 250 of FIG. 2, and BLS footprints 340 of FIGS. 3-5.

After operations 601-606, a circuit board is produced. To form a circuit board assembly which includes populated components and other elements, further manufacturing operations can be performed. Among these operations, surface mount capacitors are populated onto the capacitor footprints to form a filter at the impedance barrier resultant from the fence region. The filter is configured to route noise of the electrical current to a ground plane at the fence region.

See example capacitors 138 of FIGS. 1-2 and capacitors 333 of FIGS. 3-5. As noted herein, a variety of capacitance values can be selected to achieve a desired filtering performance across several frequency ranges. In addition to the capacitor components, other components can be populated, such as the power supply circuitry components, load device components, and a variety of other components. Solder masking can be employed to direct reflow of solder paste applied to the surfaces of the circuit board.

FIG. 7 is now presented to illustrate various configurations of vias and capacitors located at a fence region. These configurations can be employed in any of the aforementioned examples, such as fence region 134 and filter 136 of FIGS. 1 and 2, fence region 321 of FIGS. 3-5, or the manufacturing and assembly operations in FIG. 6. The term "alternating" used below can refer to various staggered, interspersed, or intermixed arrangements among vias and capacitors.

View 700 includes fence region 740 having an array of ground plane vias 701, an array of power plane vias 702, and an array of capacitors 703. In the example of view 700, capacitors 703 are offset from a centerline of ground plane vias 701, and are placed between power plane vias 702 and ground plane vias 701.

View 710 includes fence region 741 having an array of ground plane vias 711, an array of power plane vias 742, and an array of capacitors 713. In the example of view 710, capacitors 713 are aligned with a centerline of ground plane vias 711, and form a tighter packing between power plane vias 712 and ground plane vias 701.

View 720 includes fence region 742 having an array of ground plane vias 721, two arrays of power plane vias 722 and 723, and two arrays of capacitors 724 and 725. In the example of view 720, capacitors are offset from a centerline of ground plane vias 721, and are placed between corresponding power plane vias and ground plane vias 721. In this arrangement, a first array of capacitors 724 and vias 722 can be configured to couple to a first power plane, and a second array of capacitors 725 and vias 723 can be configured to couple to a second power plane. In other examples, capacitors and vias can be staggered or alternating as to which power plane is connected thereto. The example in view 720 includes a higher density configuration to fit in more power plane vias and capacitors than found in view 700 or 710, such as to have filtering for more than one power plane at a single fence region.

View 730 includes fence region 743 having an array of ground plane vias 731, two left side arrays of power plane vias 732 and 733, two right side arrays of power plane vias 734 and 735, two left side arrays of capacitors 736 and 737, and two right side arrays of capacitors 738 and 739. In the example of view 730, capacitors are offset from a centerline of ground plane vias 731, and are placed between corresponding power plane vias and ground plane vias 731. In this arrangement, a first left side array of capacitors 736 and vias 732 can be configured to couple to a first power plane, a second left side array of capacitors 737 and vias 733 can be configured to couple to a second power plane, a first right side array of capacitors 738 and vias 734 can be configured to couple to a third power plane, and a second right side array of capacitors 739 and vias 735 can be configured to couple to a fourth power plane. In other examples, capacitors and vias can be staggered or alternating as to which power plane is connected thereto. The example in view 730 includes a higher density configuration to fit in more power plane vias and capacitors than found in view 700, 710, or 720, such as to have filtering for many power planes at a single fence region.

The configurations illustrated in views 700, 710, 720, and 730 can support various configurations of power plane vias and capacitors. In one example configuration, more than one power plane is included in a circuit board, with each power plane coupled between corresponding power conversion circuitry and load circuitry. Sets of power plane vias can couple to different power planes, and associated capacitors can then filter noise from a corresponding power plane. Thus, a combined fence region can be established for multiple power planes. Other examples can have the capacitors for filtering a particular power plane be placed on opposite surfaces of the circuit board, but still have alternating power plane vias. Furthermore, capacitance values selected for each capacitor can vary based on the properties of the associated power plane, or properties of the noise desired to be filtered. For example, instead of (or in combination with) the multiple power plane configurations noted above, capacitance values of the capacitors can be alternated to include several discrete values, each value corresponding to a different frequency range of noise to be filtered. If a single power plane is employed, many different-valued capacitors can be employed in a single fence region to filter various different components of noise.

Throughout the capacitor and filter examples, the use of more capacitors can achieve a lower ESR for better filtering performance, but portions of the quantity of capacitors might be instead dedicated to different filter frequency ranges, leading to a slightly higher ESR per-frequency range. Thus, the quantity of capacitors for a given fence region can be balanced against the desired ESR target, filtering performance targets, and frequency targets. Also, DC current carrying capacity of the power plane or ground plane can be considered, as noted herein. A balance can be achieved among quantity of capacitors, vias, filter performance, and DC current performance targets.

Certain inventive aspects may be appreciated from the foregoing disclosure, of which the following are various examples.

Example 1: An apparatus, comprising a circuit board having a power plane configured to carry electrical current from a power supply circuit to load circuitry. The power plane comprising a fence region that establishes an increased characteristic impedance of the power plane and having vias arrayed across the power plane which perforate the power plane and electrically couple to a ground plane of the circuit board. A filter established at the fence region by at least capacitance elements electrically coupled between the power plane and the ground plane, the filter configured to route at least a portion of noise carried by the power plane to the ground plane at the fence region.

Example 2: The apparatus of Example 1, wherein the power plane comprises, at the fence region, a neckdown having reduced planar width with respect to an adjacent region of the power plane supplying the load circuitry.

Example 3: The apparatus of Examples 1-2, wherein the capacitance elements comprise capacitors having a selected quantity of different capacitance values interspersed among the array, each of the different capacitance values selected to route a selected frequency portion of the noise to the ground plane from the power plane.

Example 4: The apparatus of Examples 1-3, wherein first terminals of the array of capacitors couple to the power plane over corresponding vias that penetrate through at least the ground plane, and wherein second terminals of the array of capacitors couple to the ground plane.

Example 5: The apparatus of Examples 1-4, wherein the ground plane is formed on a surface layer of the circuit board, and the power plane is formed on an internal layer of the circuit board.

Example 6: The apparatus of Examples 1-5, wherein the ground plane is formed on a first external surface of the circuit board and is coupled to a second ground plane by vias arrayed across the fence region t, and wherein the power plane is formed on an internal layer of the circuit board positioned between the ground plane and the second ground plane.

Example 7: The apparatus of Examples 1-6, wherein the filter is further established by additional capacitance elements arrayed across the fence region on a second external surface of the circuit board and electrically coupled between the second ground plane and the power plane.

Example 8: The apparatus of Examples 1-7, comprising board-level shield footprints configured to couple to a board-level shield component that shields against at least a portion of radiated emissions generated by the load circuitry. The fence region is positioned proximate to the board-level shield footprints, and the filter is configured to shield against at least a portion of conducted emissions generated by the load circuitry.

Example 9: The apparatus of Examples 1-8, wherein the fence region is formed to establish an increased characteristic impedance for an additional power plane. The circuit board comprising additional capacitance elements electrically coupled between the additional power plane and the ground plane, the additional capacitance elements configured to route at least a portion of noise carried by the additional power plane to the ground plane at the fence region.

Example 10: A method, comprising forming a circuit board having a power plane that establishes a pathway for electrical current from power supply circuitry to load circuitry, and forming the power plane as having a fence region that establishes an increased characteristic impedance of the power plane and having vias arrayed across the power plane which perforate the power plane and electrically couple to a ground plane of the circuit board. The method also includes forming footprints for surface mount capacitors arrayed across the fence region, and forming vias in the circuit board coupling first terminals of the capacitors to the power plane.

Example 11: The method of Examples 10, comprising populating the surface mount capacitors onto the footprints to form a filter configured to route at least a portion of noise generated by the load circuitry to a ground plane at the fence region.

Example 12: The method of Examples 10-11, wherein the surface mount capacitors comprise a selected quantity of different capacitance values interspersed among each other, with each of the different capacitance values selected to route a selected frequency portion of the noise to the ground plane from the power plane.

Example 13: The method of Examples 10-12, wherein second terminals of the array of capacitors couple to a ground plane at the fence region.

Example 14: The method of Examples 10-13, wherein a ground plane is formed on a surface layer of the circuit board, and the power plane is formed on an internal layer of the circuit board.

Example 15: The method of Examples 10-14, wherein a ground plane is formed on a first external surface of the circuit board and is coupled to a second ground plane by vias arrayed across the fence region, and wherein the power plane is formed on an internal layer of the circuit board positioned between the ground plane and the second ground plane.

Example 16: The method of Examples 10-15, comprising forming board-level shield footprints on the circuit board proximate to the fence region that are configured to couple to a board-level shield component.

Example 17: An assembly, comprising a circuit board comprising a ground plane formed on a first surface of the circuit board, and a power plane formed on an internal layer of the circuit board and configured to provide a pathway for electrical current from power supply circuitry to load circuitry, wherein the power plane comprises a fence region that establishes an increased characteristic impedance of the power plane and having vias arrayed across the power plane which perforate the power plane and electrically couple to a ground plane of the circuit board. Footprints for surface mount capacitors are arrayed across the fence region, with first terminals of the footprints coupled through vias to the power plane and second terminals of the footprints coupled to the ground plane.

Example 18: The assembly of Example 17, comprising capacitors populated onto the footprints that form a filter configured to route at least a portion of noise generated by the load circuitry to the ground plane at the fence region.

Example 19: The assembly of Examples 17-18, wherein the capacitors comprise a selected quantity of different capacitance values interspersed among each other, with each of the different capacitance values selected to route a selected frequency portion of the noise to the ground plane from the power plane.

Example 20: The assembly of Examples 17-20, the circuit board comprising board-level shield footprints arrayed across the fence region and coupled to the ground plane, wherein the board-level shield footprints are configured to couple to a board-level shield component.

The functional block diagrams, operational scenarios and sequences, and flow diagrams provided in the Figures are representative of exemplary systems, environments, and methodologies for performing novel aspects of the disclosure. The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

The various materials and manufacturing processes discussed herein are employed according to the descriptions above. However, it should be understood that the disclosures and enhancements herein are not limited to these materials and manufacturing processes, and can be applicable across a range of suitable materials and manufacturing processes. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. An apparatus, comprising:

a circuit board having a power plane configured to carry electrical current from a power supply circuit to load circuitry;

the power plane comprising a fence region comprising a neckdown of a conductive area having reduced planar width with respect to an adjacent region of the power plane supplying the load circuitry, wherein the fence region is configured to pass DC current carried by the power plane and establish an increased characteristic impedance of the power plane at the fence region with respect to noise having a frequency range using at least a set of vias arrayed across the fence region of the power plane which perforate the power plane and restrict the conductive area of the power plane; and a filter established at the fence region by at least capacitance elements electrically coupled between a ground plane and additional vias to the power plane, the filter configured to shunt at least a portion of the noise affected by the increased characteristic impedance to the ground plane at the fence region.

2. The apparatus of claim 1, wherein the capacitance elements comprise capacitors having a selected quantity of different capacitance values interspersed among the array, each of the different capacitance values selected to route a selected frequency portion of the frequency range of the noise to the ground plane from the power plane.

3. The apparatus of claim 1, wherein first terminals of the array of capacitors couple to the power plane over corresponding ones of the additional vias that penetrate through at least the ground plane; and wherein second terminals of the array of the capacitors couple to the ground plane.

4. The apparatus of claim 3, wherein the ground plane is formed on a surface layer of the circuit board, and the power plane is formed on an internal layer of the circuit board.

5. The apparatus of claim 1, wherein the ground plane is formed on a first external surface of the circuit board and is coupled to a second ground plane by the vias arrayed across the fence region; and wherein the power plane is formed on an internal layer of the circuit board positioned between the ground plane and the second ground plane.

6. The apparatus of claim 5, wherein the filter is further established by additional capacitance elements arrayed across the fence region on a second external surface of the circuit board and electrically coupled between the second ground plane and the power plane.

7. The apparatus of claim 1, comprising:

board-level shield footprints configured to couple to a board-level shield component that shields against at least a portion of radiated emissions generated by the load circuitry;

wherein the fence region is positioned proximate to the board-level shield footprints; and wherein the filter is configured to shield against at least a portion of conducted emissions generated by the load circuitry.

8. The apparatus of claim 1, wherein the fence region is formed to establish an increased characteristic impedance for an additional power plane; and comprising:

additional capacitance elements electrically coupled between the additional power plane and the ground plane at the fence region, the additional capacitance elements configured to route at least a portion of noise carried by the additional power plane to the ground plane at the fence region.

9. A method, comprising:

forming a circuit board having a power plane that establishes a pathway for electrical current from power supply circuitry to load circuitry;

forming the power plane as having a fence region comprising a neckdown of a conductive area having reduced planar width with respect to an adjacent region of the power plane supplying the load circuitry, wherein the fence region is configured to pass DC current carried by the power plane and establish an increased characteristic impedance of the power plane at the fence region with respect to noise having a frequency range with at least a set of vias arrayed across the fence region of the power plane which perforate the power plane and restrict a conductive area of the power plane;

forming footprints for surface mount capacitors arrayed across the fence region; and forming additional vias in the circuit board coupling terminals of the surface mount capacitors to the power plane.

10. The method of claim 9, comprising:

populating the surface mount capacitors onto the footprints to form a filter configured to shunt at least a portion of the noise carried by the power plane and affected by the increased characteristic impedance to a ground plane at the fence region.

11. The method of claim 10, wherein the surface mount capacitors comprise a selected quantity of different capacitance values interspersed among each other, with each of the different capacitance values selected to route a selected frequency portion of the frequency range of the noise to the ground plane from the power plane.

12. The method of claim 9, wherein second terminals of the array of capacitors couple to a ground plane at the fence region.

13. The method of claim 9, wherein a ground plane is formed on a surface layer of the circuit board, and the power plane is formed on an internal layer of the circuit board.

14. The method of claim 9, wherein a ground plane is formed on a first external surface of the circuit board and is coupled to a second ground plane by the vias arrayed across the fence region; and wherein the power plane is formed on an internal layer of the circuit board positioned between the ground plane and the second ground plane.

15. The method of claim 9, comprising:

forming board-level shield footprints on the circuit board proximate to the fence region that are configured to couple to a board-level shield component.

16. An assembly, comprising:

a circuit board comprising:

a ground plane formed on a first surface of the circuit board;

a power plane formed on an internal layer of the circuit board and configured to provide a pathway for electrical current from power supply circuitry to load circuitry, wherein the power plane comprises a fence region comprising a neckdown of a conductive area having reduced planar width with respect to an adjacent region of the power plane supplying the load circuitry, wherein the fence region is configured to pass DC current carried by the power plane and establish an increased characteristic impedance of the power plane at the fence region with respect to noise having a frequency range with at least a set of vias arrayed across the fence region of the power plane which perforate the power plane and restrict a conductive area of the power plane; and footprints for surface mount capacitors arrayed across the fence region, with first terminals of the footprints coupled through additional vias to the power plane and second terminals of the footprints coupled to the ground plane.

17. The assembly of claim 16, comprising:

capacitors populated onto the footprints that form a filter configured to shunt at least a portion of the noise carried by the power plane and affected by the increased characteristic impedance to the ground plane at the fence region.

18. The assembly of claim 17, wherein the capacitors comprise a selected quantity of different capacitance values interspersed among each other, with each of the different capacitance values selected to route a selected frequency portion of the frequency range of the noise to the ground plane from the power plane.

19. The assembly of claim 16, the circuit board comprising:

board-level shield footprints arrayed across the fence region and coupled to the ground plane, wherein the board-level shield footprints are configured to couple to a board-level shield component.

* * * * *